United States Patent [19]

Takahashi

[11] Patent Number: 5,245,571
[45] Date of Patent: Sep. 14, 1993

[54] SENSE AMPLIFIER CIRCUIT IMPLEMENTED BY BIPOLAR TRANSISTOR AND IMPROVED IN CURRENT CONSUMPTION

[75] Inventor: Hiroyuki Takahashi, Tokyo, Japan

[73] Assignee: NEC Corporation, Tokyo, Japan

[21] Appl. No.: 799,203

[22] Filed: Nov. 27, 1991

[30] Foreign Application Priority Data

Nov. 30, 1990 [JP] Japan .................. 2-340103

[51] Int. Cl.$^5$ .......................................... G11C 11/40
[52] U.S. Cl. ..................................... 365/185; 307/530
[58] Field of Search ................. 365/185; 307/530, 355

[56] References Cited

U.S. PATENT DOCUMENTS

| | | | |
|---|---|---|---|
| 4,430,580 | 2/1984 | Lovelace | 307/530 X |
| 4,434,381 | 2/1984 | Stewart | 307/530 |
| 4,629,911 | 12/1986 | Bebernes et al. | 307/530 X |
| 4,853,899 | 8/1989 | Kitsukwa et al. | 307/530 X |
| 4,879,681 | 11/1989 | Miwa et al. | 307/530 X |
| 4,939,693 | 7/1990 | Tran | 307/330 X |

FOREIGN PATENT DOCUMENTS

2154086 8/1985 United Kingdom .

OTHER PUBLICATIONS

1979 IEEE International Solid State Circuit Conference, Feb. 15, 1979, pp. 850–854.

Primary Examiner—Eugene R. LaRoche
Assistant Examiner—Do Hyun Yoo
Attorney, Agent, or Firm—Sughrue, Mion, Zinn, Macpeak & Seas

[57] ABSTRACT

A differential amplifier circuit includes a differential amplifier responsive to an input differential voltage signal and implemented by a parallel combination of first and second bipolar transistors associated with a first constant current source, a pair of interconnections coupled with the collector nodes of the first and second bipolar transistors, a current-to-voltage converter having a series combination of a resistor and a third bipolar transistor associated with the first bipolar transistor and a series combination of a resistor and a fourth bipolar transistor associated with the second bipolar transistor, and a standby current source coupled between the third and fourth bipolar transistors and a ground voltage line, and branch currents from the first and second bipolar transistors are inversely proportional to branch currents from the third and fourth bipolar transistors to the standby current source so that the third and fourth bipolar transistors drive the pair of interconnections at high speed without sacrifice of current consumption.

6 Claims, 6 Drawing Sheets

SENSE AMPLIFIER CIRCUIT IMPLEMENTED BY BIPOLAR TRANSISTOR AND IMPROVED IN CURRENT CONSUMPTION

FIELD OF THE INVENTION

This invention relates to a sense amplifier circuit and, more particularly, to a bipolar implementation of the sense amplifier circuit incorporated in, for example, a semiconductor memory device.

DESCRIPTION OF THE RELATED ART

A semiconductor memory device provides a data storage for an electronic system, and the data bit is read out from the memory cell to a sense amplifier circuit for rapidly discriminating the logic level of the data bit. A typical example of the sense amplifier circuit is illustrated in FIG. 1, and largely comprises a multiplexer 1 and a current-to-voltage converter 2. The multiplexer 1 is implemented by a plurality of differential circuits 1a and 1b to 1n, and the differential circuits 1a to 1n are similar in circuit arrangement to one another. Each of the differential circuits 1a to 1n comprises a pair of n-p-n type bipolar transistors Q1 and Q2 arranged in parallel and a constant current source I1a coupled between the emitter nodes of the n-p-n type bipolar transistors Q1 and Q2 and a ground voltage line, and read-out data bits in the form of differential voltage are respectively supplied to the base nodes of the pairs of n-p-n type bipolar transistors incorporated in the respective differential amplifier circuits 1a to 1n. A read-out data bus 3 is shared between the differential circuits 1a to 1n, and is coupled with the collector nodes of the pairs of n-p-n type bipolar transistors Q1 and Q2. Since one of the differential amplifier circuits 1a to 1n is activated with a control signal CTL1 supplied to the constant current sources, the differential voltage indicative of one of the read-out data bits is rapidly converted into differential current by means of the pair of n-p-n type bipolar transistors Q1 and Q2, and the differential current is relayed to the current-to-voltage converter 2.

The current-to-voltage converter 2 comprises two series combinations of resistors 2a and 2b, n-p-n type bipolar transistors Q3 and Q4 and constant current sources 2c and 2d, and the read-out data bus 3 is coupled with the emitter nodes of the n-p-n type bipolar transistors Q3 and Q4. The collector nodes of the n-p-n type bipolar transistors Q3 and Q4 are coupled with an output buffer circuit (not shown). Since a common constant voltage signal B2 is supplied to the base nodes of the n-p-n type bipolar transistors Q3 and Q4, the differential current is converted into a differential voltage by means of the two series combinations, and the differential voltage indicative the selected read-out data bit is supplied to the output buffer circuit.

However, a problem is encountered in the prior art sense amplifier circuit in that current consumption is increased with integration density. In detail, when a larger data storage is fabricated on a single semiconductor chip, the columns of the memory cells and, accordingly, the differential circuits 1a to 1n are increased, and, as a result, the read-out data bus 3 is prolonged. The longer read-out data bus a semiconductor memory device is equipped with, the more parasitic capacitance the read-out data bus 3 is coupled with. Therefore, the differential current is slowly developed by the sense amplifier circuit due to the large parasitic capacitance. In order to maintain high-speed read-out operation, it is necessary to increase the current driving capabilities of the differential circuits 1a to 1n as well as of the n-p-n type bipolar transistors Q3 and Q4. However, the large current driving capabilities of the n-p-n type bipolar transistors Q3 and Q4 results in large current consumption. Thus, there is a trade-off between the read-out speed and the current consumption.

SUMMARY OF THE INVENTION

It is therefore an important object of the present invention to provide a sense amplifier circuit which improves current consumption without sacrifice of read-out speed.

To accomplish the object, the present invention proposes to concentrate current to one of interconnections coupled with a differential amplifier circuit depending upon an input differential voltage signal.

In accordance with the present invention, there is provided a sense amplifier circuit comprising: a) a differential amplifier circuit having first and second bipolar transistors controlled with an input differential voltage signal supplied to the base nodes thereof, and a first constant current source coupled between the emitter nodes of the first and second bipolar transistors and a first constant voltage source, and activated with an activation signal for allowing first and second branch-currents to respectively pass through the first and second bipolar transistors, b) a pair of interconnections respectively coupled with the collector nodes of the first and second bipolar transistors, c) a current-to-voltage converting unit having a first series combination of a first resistive element and a third bipolar transistor associated with the first bipolar transistor and coupled between a second constant voltage source and one of the pair of interconnections, a second series combination of a second resistive element and a fourth bipolar transistor associated with the second bipolar transistor and coupled between the second constant voltage source and the other of the pair of interconnections, and a third constant voltage source coupled with the base nodes of the third and fourth bipolar transistors for producing an output differential voltage signal at the collector nodes of the third and fourth bipolar transistors; and d) a source of standby current associated with the first and second series combinations, and having a second constant current source coupled with the first constant voltage source, and distributing means coupled between the pair of interconnections and the second constant current source and operative to allow third and fourth branch-currents to flow from the third and fourth bipolar transistors to the second constant current source, the first and second branch currents being inversely proportional to the third and fourth branch currents, respectively.

BRIEF DESCRIPTION OF THE DRAWINGS

The features and advantages of the sense amplifier circuit according to the present invention will be more clearly understood from the following description taken in conjunction with the accompanying drawings in which.

DESCRIPTION OF THE PREFERRED EMBODIMENTS

First Embodiment

Figure 2:
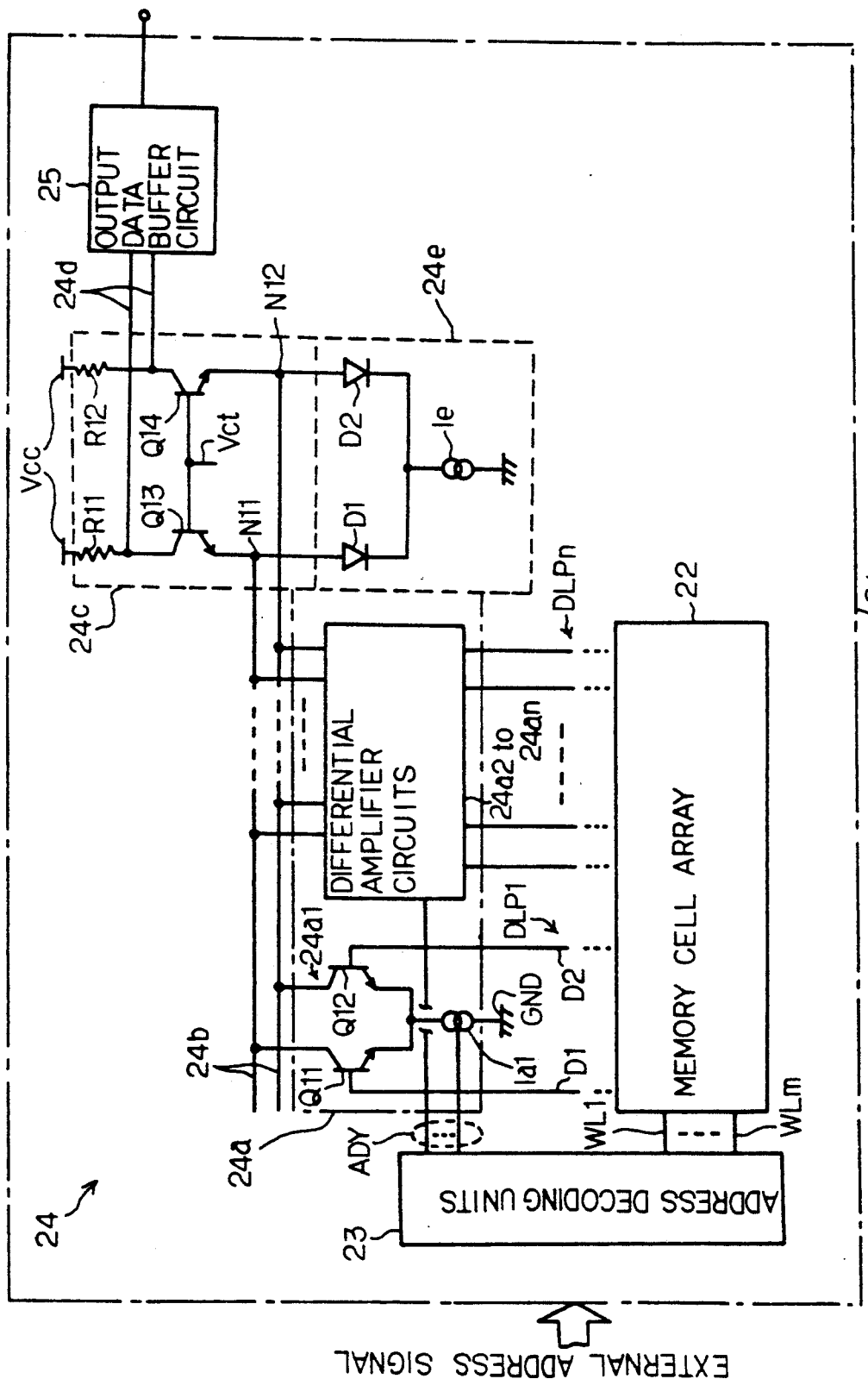
FIG. 2 is a circuit diagram showing the arrangement of a semiconductor memory device equipped with a sense amplifier circuit according to the present invention.

Turning to FIG. 2 of the drawings, a semiconductor memory device embodying the present invention is fabricated on a single semiconductor chip 21, and largely comprises a memory cell array 22 implemented by a large number of memory cells, address decoding units 23 selectively driving word lines WL1 to WLm for selectively reading out data bits from the memory cell array 22, a plurality of digit line pairs DLP1 to DLPn for propagating the data bits to a sense amplifier circuit 24, and an output data buffer circuit coupled with the sense amplifier circuit 24. Although other component units are further incorporated in the semiconductor memory device, FIG. 2 does not show them for the sake of simplicity.

The sense amplifier circuit 24 comprises differential amplifier unit coupled with the digit line pairs DLP1 to DLPn and a read-out data bus 24b, a current-to-voltage converting unit 24c coupled between the read-out data bus 24b and an output data bus 24d, and a source of standby current 24e associated with the current-to-voltage converting unit 24c. The differential amplifier unit 24a has a plurality of differential amplifier circuits 24a1 and 24a2 to 24an similar in circuit arrangement to one another, and the differential amplifier circuits 24a1 to 24an are respectively associated with the digit line pairs DLP1 to DLPn. Each of the differential amplifier circuits 24a1 to 24an is implemented by first and second n-p-n type bipolar transistors Q11 and Q12 coupled between the read-out data bus 24b and the associated digit line pair as well as a first constant current source Ia1 coupled between the emitter nodes of the first and second n-p-n type bipolar transistors Q11 and Q12 and a ground voltage line GND. The first constant current sources of the differential amplifier circuits 24a1 to 24an are selectively activated with a decoded address signal ADY fed from the address decoding units 23, and an input differential voltage signal on the associated digit line pair switches the first and second n-p-n type bipolar transistors Q11 and Q12. Since the collector currents of the n-p-n type bipolar transistors Q11 and Q12 are dependent upon the input differential voltage signal, the constant current of the first constant current source Ia1 is split into first and second branch currents, and the input differential voltage signal is converted into the first and second branch currents. The number of the differential amplifier circuits 24a1 to 24an is dependent to the size of the data storage or the memory cell array 22. However, a commercial device has 32 to 128 differential amplifier circuits, and the read-out data bus 24b ranges from 10 to 20 millimeters. Such an extremely long read-out data bus 24b is coupled with large parasitic capacitance of 10 to 30 pF.

The current-to-voltage converting unit 24c comprises a series combination of a first resistor R11 and a third n-p-n type bipolar transistor Q13 coupled between a source of power voltage Vcc and one of the signal lines of the read-out data bus 24b, a series combination of a second resistor R12 and a fourth n-p-n type bipolar transistor Q14 coupled between the source of power voltage Vcc and the other signal line of the read-out data bus 24b, and a constant voltage line Vct coupled with the base nodes of the n-p-n type bipolar transistors Q13 and Q14. The third and fourth n-p-n type bipolar transistors Q13 and Q14 supply currents to the read-out data bus 24b as well as the source of standby current 24e. The output data bus 24d is coupled with the collector nodes of the third and fourth n-p-n type bipolar transistors Q13 and Q14, and the first and second branch currents relayed to the third and fourth n-p-n type bipolar transistors Q13 and Q14 are converted into an output differential voltage signal on the output data bus 24d. The output differential voltage signal is propagated to the output data buffer circuit 25, and an output data signal is supplied from the output data buffer circuit 25 to an external device.

The source of standby current 24e comprises diode elements D1 and D2 coupled with the read-out data bus 24b, and a constant current source Ie coupled between the diode elements D1 and D2 and the ground voltage line GND. The diode elements D1 and D2 allow third and fourth branch currents to flow into the second constant current source Ie, and the total amount of the third and fourth branch currents is referred to as "standby current".

The data bit stored in the memory cell usually swings the input differential voltage signal at 50 to hundreds millivolts, and the input differential voltage signal is minimized in so far as the differential amplifier circuit discriminates the difference because of a large amount of parasitic capacitance coupled with the associated digit line pair. The early switching action of the differential amplifier circuit is conducive to a high-speed read-out operation.

On the other hand, the magnitude of the output differential voltage signal is dominated by the output data buffer circuit 25. If the output data buffer circuit 25 is implemented by an emitter-coupled logic circuit, the current-to-voltage converting unit 24c is expected to produce the output differential voltage signal of at least 250 millivolts. The third and fourth n-p-n type bipolar transistors Q13 and Q14 block nodes N11 and N12 from the wide dynamic range of the output differential voltage signal, and offer voltage clamp against the output differential voltage signal. However, the first and second branch currents are causative of voltage variation at the anodes of the diode elements D1 and D2, and the voltage variation ranges from tens milliamperes to hundreds milliamperes. Since a larger amount of one of the first and second branch current results in large voltage decay at the anode of the associated diode element D1 or D2, the following inverse relation is established between the first and second branch currents I1 and I2 and the third and fourth branch currents I3 and I4.

$$I1/I2 = I4/I3 \qquad \text{Equation 1}$$

If the first constant current source Ia1 passes current much larger than that of the second constant current source Ie, most of the current Ie flows through one of the diode elements D1 and D2. The ratio (I1+I2)/(I3+I4) ranges from 3 to 10, and most of the current supplied from the current-to-voltage converting unit 24c is available for one of the differential amplifier circuits 24a1 to 24an. In fact, even though the ratio (I1+I2) / (I3+I4) is the minimum value of 3, about 80% of the standby current is supplied from either third or fourth n-p-n type bipolar transistor Q13 or Q14 associated with one of the first and second n-p-n type bipolar transistors Q11 and Q12 in off-state, and most of the current passing through the other of the third and fourth n-p-n type bipolar transistors Q13 and Q14 is available for the activated differential amplifier circuit. This results in reduction of standby current and, accordingly, improvement in current consumption of the sense amplifier circuit. In fact, the standby current consumed by the source 24e is a half of the total amount of currents passing through the constant current sources 2c and 2d of the prior art sense amplifier circuit.

Figure 3:
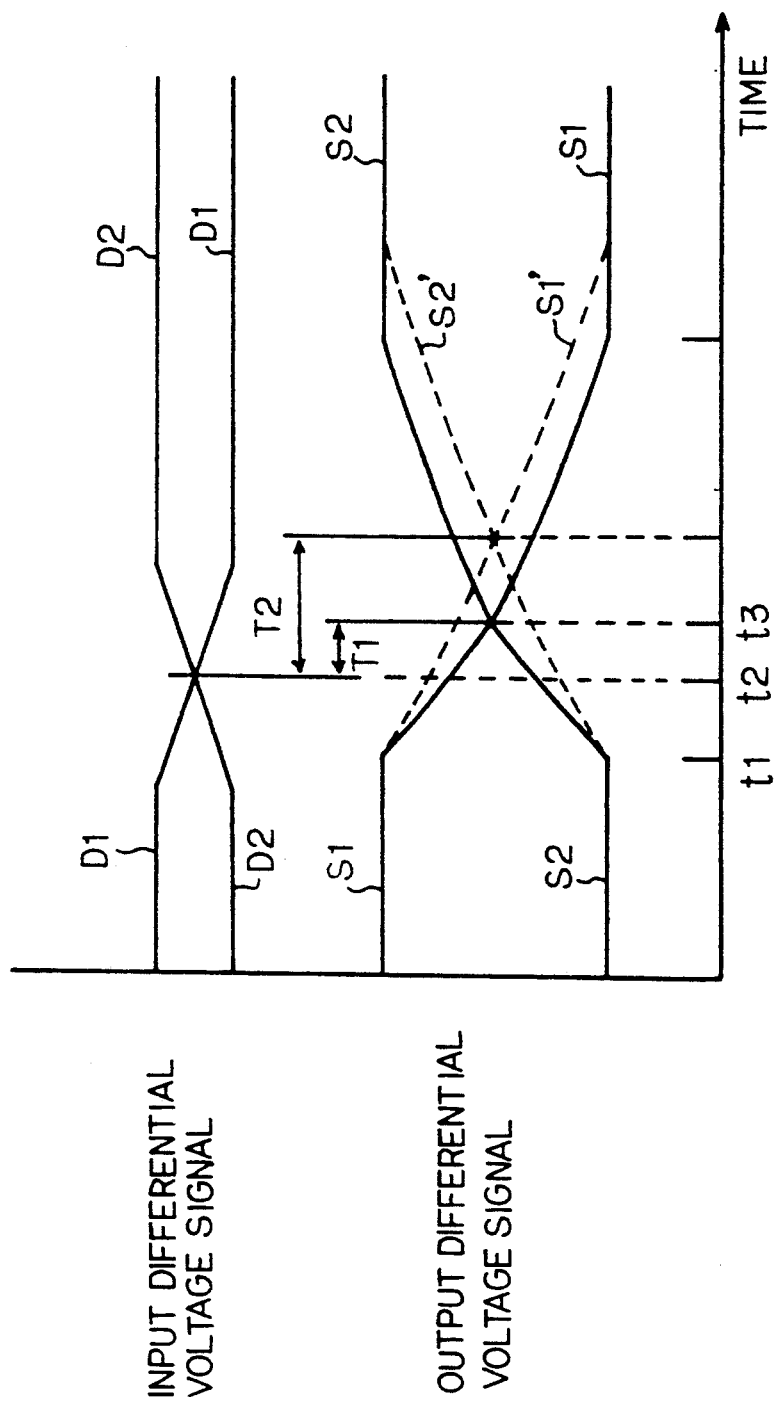
FIG. 3 is a diagram showing the characteristics of the sense amplifier circuit in comparison with the characteristics of the prior art sense amplifier circuit.

Description is hereinbelow made on circuit behavior of the semiconductor memory device with reference to FIG. 3 of the drawings. Assuming now that an external address signal is indicative of an address assigned to one of the memory cells storing a data bit of logic "0" level before time t1, one of the word lines WL1 is lifted to an active level, and the data bit of logic "0" level read out therefrom causes the associated digit line pair DLP1 to have a digit line D1 of a high voltage level and a complementary digit line D2 of a low voltage level. This results in that the output data bus 24d has a signal line S1 of a high voltage level and a complementary signal line S2 of a low voltage level. If the external address signal changes the address from the previous address assigned to the aforementioned memory cell to another address assigned to another memory cell storing a data bit of logic "1" level, the word line WLm allows the new data bit of logic "1" level as well as other data bits to be read out to the associated digit line pairs DLP1 to DLPn, and the digit line pair DLP1 starts on alternating the voltage levels at time t1. Since the predecoded address signal ADY selects the differential amplifier circuit 24a1 from the differential amplifier unit 24a, the emitter nodes of the n-p-n type bipolar transistors Q11 and Q12 are grounded through the first constant current source Ia1, and the n-p-n type bipolar transistors Q11 and Q12 are responsive to the input differential voltage signal indicative of the data bit of logic "1" level. Since the digit line D1 is decayed, the first branch current is decreased, and the second branch current is increased with the complementary digit line D2. The voltage levels on the digit line D1 and the complementary digit line D2 are balanced with each other, and the first and second branch currents are also equal to each other at time t2. Before time t2, the node N12 is higher than the node N11, and the second constant current source Ie continues to discharge the node N12, and the n-p-n type bipolar transistor Q13 supplies most of current to the n-p-n type bipolar transistor Q11 with sacrifice of negligible third branch current. Thus, most of the current passing through the n-p-n type bipolar transistor Q13 is supplied to the associated signal line of the read-out data bus 24b, and the associated signal line is rapidly charged up without any supplemental current source.

Figure 1:
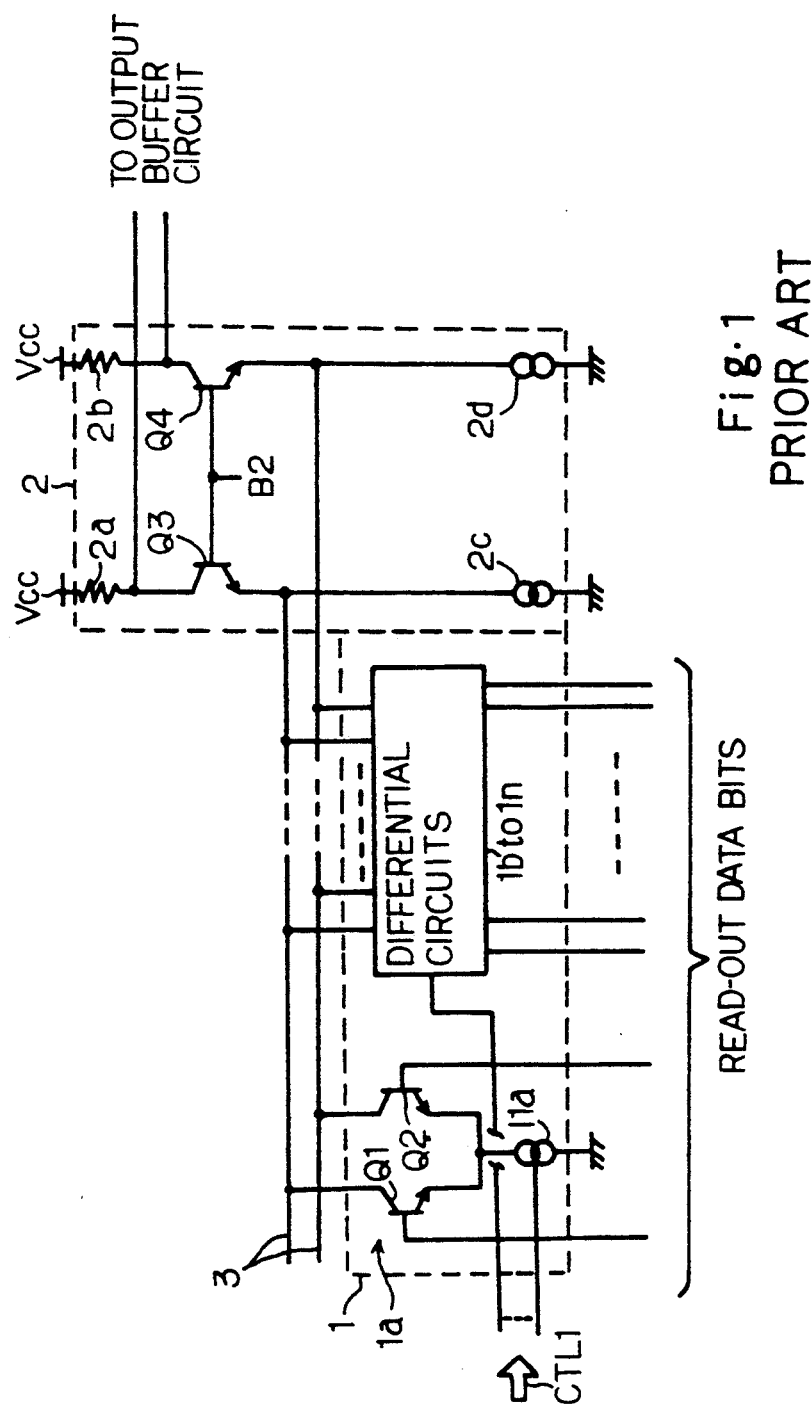
FIG. 1 is a circuit diagram showing the circuit arrangement of the prior art sense amplifier circuit.

However, the first branch current is further decreased and, accordingly, the second branch current is decreased. The node N11 becomes higher than the node N12, and the third branch current occupies most of the standby current passing through the second constant current source Ie. The voltage levels at the nodes N11 and N12 thus exchange the previous positions, and the n-p-n type bipolar transistors Q13 and Q14 produces the output differential voltage signal on the output data bus 24d. Namely, the signal lines S1 and S2 are balanced with each other at time t3, and the sense amplifier circuit implementing the first embodiment merely introduces time delay T1 into the production of the output differential voltage signal. However, if the same input differential voltage signal is applied to the prior art sense amplifier circuit shown in FIG. 1, the output differential voltage signal traces dash lines S1' and S2', and time delay T2 is introduced by the prior art sense amplifier circuit. The time delay T1 is about 10% to 50% of the time delay T2.

As will be understood from the foregoing description, the third and fourth branch currents are variable by virtue of the source of standby current 24e, and the read-out data bus 24b or interconnections are selectively charged with current passing through the n-p-n type bipolar transistors Q13 and Q14 at high-speed. In other words, the current passing through one of the n-p-n type bipolar transistors Q13 and Q14 is effectively concentrated upon charge-up of the associated signal line of the read-out data bus 24b, and the sense amplifier circuit according to the present invention can rapidly drive the parasitic capacitance coupled with the read-out data bus 24b without increasing the current driving capability thereof.

Second Embodiment

Figure 4:
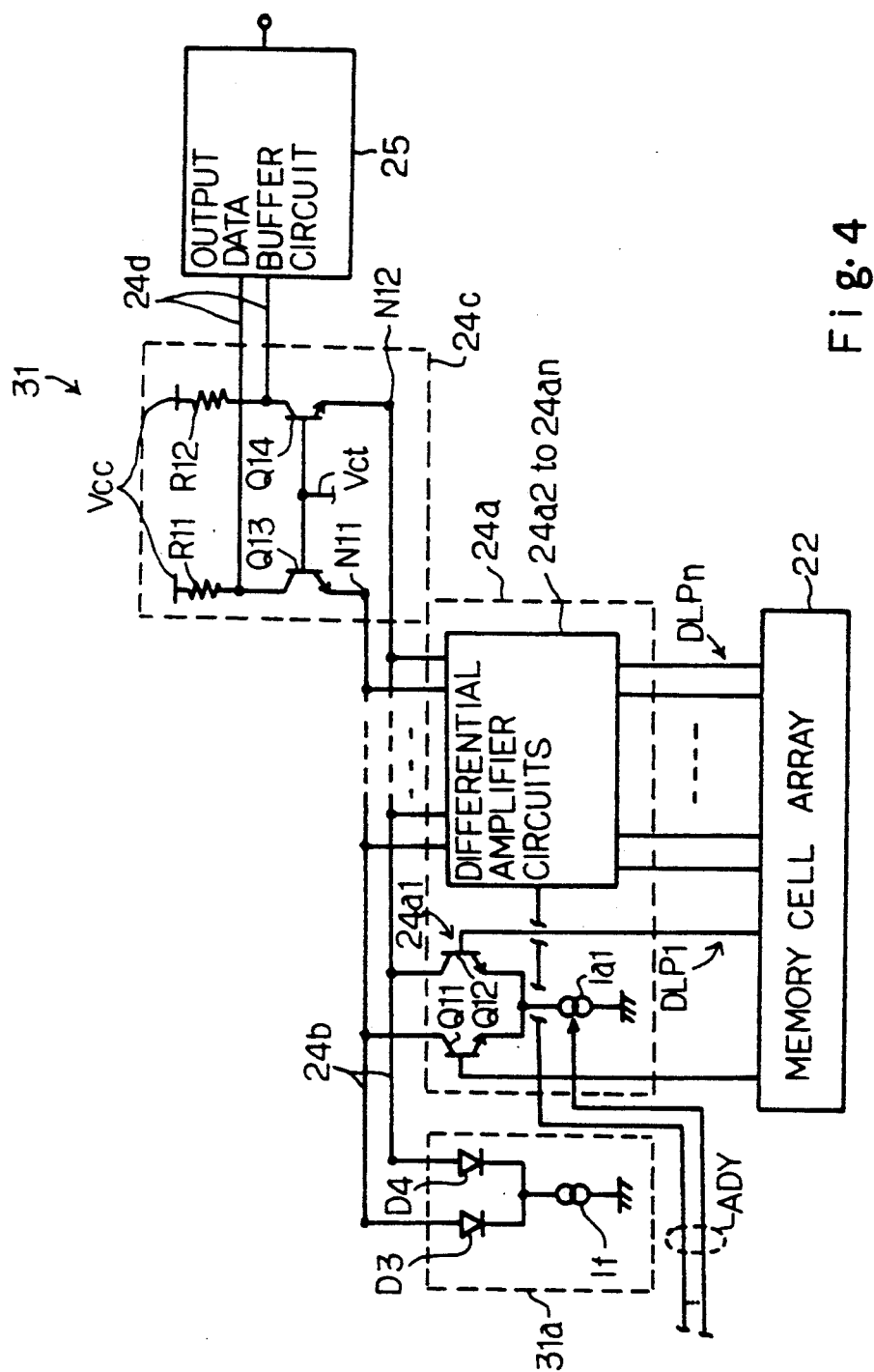
FIG. 4 is a circuit diagram showing the arrangement of a sense amplifier circuit incorporated in another semiconductor memory device according to the present invention.

Turning to FIG. 4 of the drawings, an essential part of another semiconductor memory device embodying the present invention is illustrated. The semiconductor memory device shown in FIG. 4 is similar in circuit arrangement to the first embodiment except for location of a source of standby current 31a of a sense amplifier circuit 31. Therefore, the other component units and circuits are labeled with the same references used for the corresponding units and circuits of the first embodiment without detailed description.

The source of standby current 31a is similar in circuit arrangement to the source of standby current 24e, and comprises diode elements D3 and D4 associated with a second constant current source If. In the first embodiment, not only the current-to-voltage converting unit 24c but also the source of standby current 24e are coupled with the right end of the read-out data bus 24b. However, the source of standby current 31a is coupled with the opposite end to the current-to-voltage converting unit 24c. In other words, the differential amplifier circuits 24a1 to 24an are coupled between the source of standby current 31a and the current-to-voltage converting unit 24c.

Figure 5:
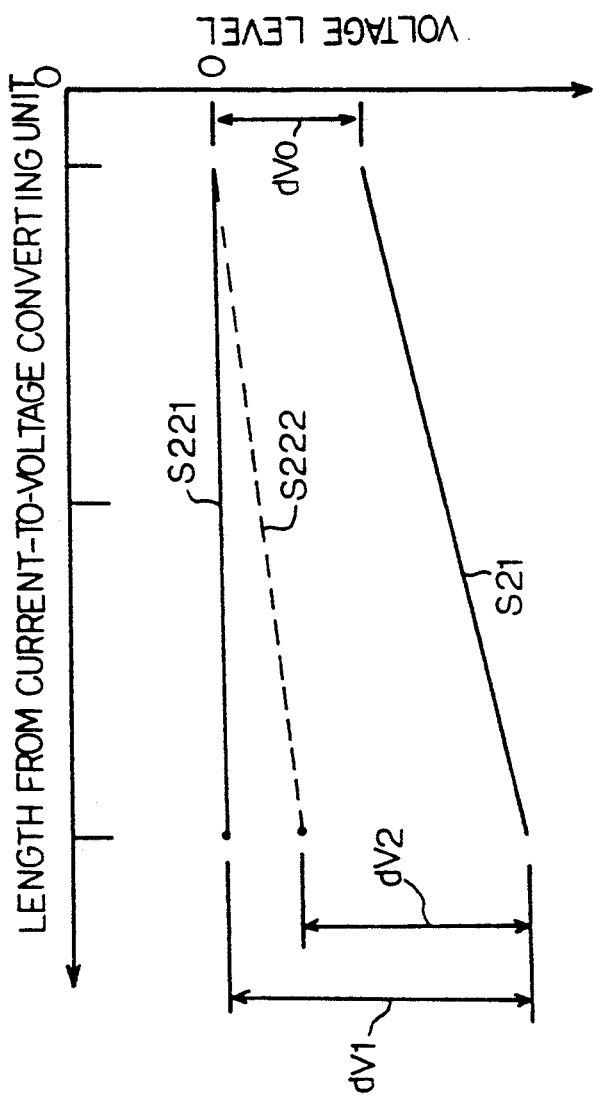
FIG. 5 is a graph showing voltage decay along the read-out data buses incorporated in the sense amplifier circuits shown in FIGS. 2 and 4.

The location of the source of standby current 31a is advantageous in view of perfect distribution of the standby current as well as of high-speed propagation along the read-out data bus 24b. FIG. 5 shows voltage levels along the read-out data bus 24b in terms of length from the current-to-voltage converting unit 24c. Plots S21 stands for one of the signal lines of the read-out data bus 24b coupled with the n-p-n type bipolar transistor Q11 or Q12 supplied with the high voltage level, and is applicable for both first and second embodiments. The differential amplifier circuit in the active state is causative of voltage decay of tens to hundreds millivolts along the signal line as shown by plots S21. For this reason, larger differential voltage is applied between the diode elements D3 and D4, and allows either third or fourth branch current constitutes the standby current. Moreover, voltage levels along the other signal line of the read-out data bus 24b are different between the first and second embodiments. Namely, in the first embodiment, no current flows along the signal line, and no substantial voltage decay takes place therealong as indicated by plots S221. However, the other signal line of the second embodiment flows either third or fourth branch current, and the voltage level along the other signal line is gradually decayed as indicated by plots S222. This results in that the differential voltage dV2 at the activated sense amplifier circuit is smaller than the differential voltage dV1 of the first embodiment. The smaller differential voltage at the activated sense amplifier circuit decreases the load driven by the activated sense amplifier circuit, and the location of the source of standby current 31a is conducive to high speed read-out operation. In fact, the location of the source of standby current 31a increases the read-out operation at 10% to 20% with respect to the first embodiment. When the parasitic capacitance coupled with the read-out data bus 24b is enlarged with integration density, the second advantage of the source of standby current 31a becomes eminent.

Third Embodiment

Figure 6:
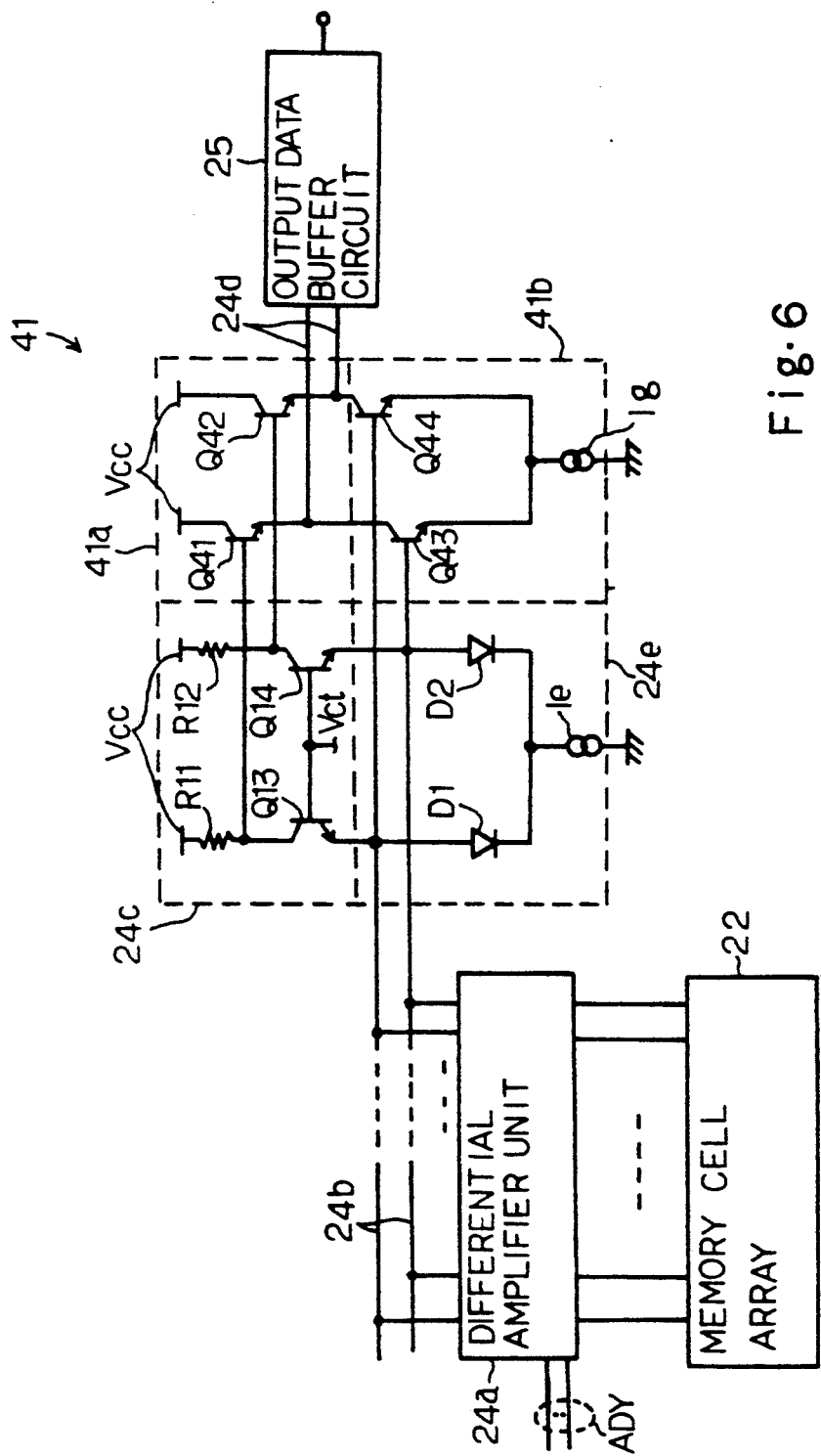
FIG. 6 is a diagram showing the arrangement of a sense amplifier circuit incorporated in yet another semiconductor memory device according to the present invention.

Turning to FIG. 6 of the drawings, yet another semiconductor memory device embodying the present invention is illustrated. A sense amplifier circuit 41 incorporated in the semiconductor memory device contains all the components units and circuits of the sense amplifier circuit 24, and corresponding units and circuits are designated by the same refernces without detailed description. The sense amplifier circuit 41 further comprises an emitter follower circuit 41a and a differential circuit 41b. The emitter follower circuit comprises n-p-n type bipolar transistors Q41 and Q42, and the base nodes of the n-p-n type bipolar transistors Q41 and Q42 are respectively coupled with the colector nodes of the n-p-n type bipolar transistors Q13 and Q14 of the current-to-voltage converting unit 24c. The emitter nodes of the n-p-n type bipolar transistors Q41 and Q42 are coupled through the output data bus 24d with the output data buffer circuit 25. The emitter follower circuit 41a quickly drives large parasitic capacitance coupled with the output data bus 24d, and one of the signal lines of the output data bus 24d is elevated to the active high level at higher speed.

The differntial circuit 41b comprises n-p-n type bipolar transistors Q43 and Q44 coupled in parallel with the emitter nodes of the n-p-n type bipolar transistors Q43 and Q44, and the base nodes are connected with the read-out data bus 24b. The emitter nodes of the n-p-n type bipolar transistors Q43 and Q44 are coupled through a constant current source Ig with the ground voltage line. Since the n-p-ntype bipolar transistos Q43 and Q44 are controlled by the read-out data bus 24b, the other signal line of the output data bus 24d is discharged by means of the assoicated n-p-n type bipolar transistor Q43 or Q44. The constant current source Ig draws the current from the other signal line of the output data bus 24d trhough the assoicated n-p-n type bipolar transistor Q43 or Q44, and any substntial current is supplied from the other n-p-n type bipolar transistor Q44 or Q43. For this reason, the emitter follower circuit 41a does not deteriorate the current consumption of the third embodiemnt.

Although particular embodiments of the present invention have been shown and described, it will be obvious to those skilled in the art that various changes and modifications may be made without departing from the spirit and scope of the present invention. For example, p-n-p type bipolar transistors may be available for fabricating a sense amplifier circuit according to the present invention. Moreover, the semiconductor memory device may form a part of an integrated circuit. Moreover, the n-p-n type bipolar transistors Q43 and Q44 may be replaced with enhancement type field effect transistors, respectively.

What is claimed is:

1. A sense amplifier circuit comprising:
    a) a differential amplifier circuit having first and second bipolar transistors controlled with an input differential voltage signal supplied to the base nodes thereof, and a first constant current source coupled between the emitter nodes of said first and second bipolar transistors and a first constant voltage source, and activated with an activation signal for allowing first and second branch-currents to respectively pass through said first and second bipolar transistors,
    b) a pair of interconnections respectively coupled with the collector nodes of said first and second bipolar transistors,
    c) a current-to-voltage converting unit having a first series combination of a first resistive element and a third bipolar transistor associated with said first bipolar transistor and coupled between a second constant voltage source and one of said pair of interconnections, a second series combination of a second resistive element and a fourth bipolar transistor associated with said second bipolar transistor and coupled between said second constant voltage source and the other of said pair of interconnections, and a third constant voltage source coupled with the base nodes of said third and fourth bipolar transistors for producing an output differential voltage signal at the collector nodes of said third and fourth bipolar transistors; and
    d) a source of standby current associated with said first and second series combinations, and having a second constant current source coupled with said first constant voltage source, and distributing means coupled between said pair of interconnections and said second constant current source and operative to allow third and fourth branch-currents to flow from said third and fourth bipolar transistors to said second constant current source, said distributing means controlling the amount of said third branch-current and the amount of said fourth branch-current depending upon a differential voltage between said interconnections so that said first and second branch currents are inversely proportional to said third and fourth branch currents, respectively.

2. A sense amplifier circuit as set forth in claim 1, in which said current-to-voltage converting unit and said distributing means are coupled with first ends of said interconnections.

3. A sense amplifier circuit as set forth in claim 1, in which said current-to-voltage converting unit is coupled with first ends of said interconnections, and in which said distributing means is coupled with second ends of said interconnections, said first ends being opposite to said second ends.

4. A sense amplifier circuit as set forth in claim 1, in which said sense amplifier circuit further comprises e) an emitter follower circuit having fifth and sixth bipolar transistors coupled between said second constant voltage source and signal lines of an output data bus and controlled by the collector nodes of said third and fourth bipolar transistors, and f) a differential circuit having seventh and eighth bipolar transistors coupled between said signal lines and a third constant current source and controlled by said interconnections.

5. A semiconductor memory device fabricated on a single semiconductor chip, comprising:
   a) a memory cell array for storing a plurality of data bits;
   b) a plurality of digit line pairs coupled with said memory cell array;
   c) a plurality of word lines coupled with said memory cell array and operative to allow said data bits to be selectively read out from said memory cell array to said plurality of digit line pairs;
   d) a plurality of differential amplifier circuits selectively activated with a decoded address signal, and each having first and second bipolar transistors controlled with an input differential voltage signal indicative of one of said data bits and supplied to the base nodes thereof, and a first constant current source coupled between the emitter nodes of said first and second bipolar transistors and a first constant voltage source, said first and second bipolar transistors allowing first and second branch-currents to respectively pass therethrough;
   e) a pair of interconnections respectively coupled with the collector nodes of said first and second bipolar transistors,
   f) a current-to-voltage converting unit having a first series combination of a first resistive element and a third bipolar transistor associated with said first bipolar transistor and coupled between a second constant voltage source and one of said pair of interconnections, a second series combination of a second resistive element and a fourth bipolar transistor associated with said second bipolar transistor and coupled between said second constant voltage source and the other of said pair of interconnections, and a third constant voltage source coupled with the base nodes of said third and fourth bipolar transistors for producing an output differential voltage signal at the collector nodes of said third and fourth bipolar transistors; and
   g) a source of standby current associated with said first and second series combinations; and having a second constant current source coupled with said first constant voltage source, and distributing means coupled between said pair of interconnections and said second constant current source and operative to allow third and fourth branch-currents to flow from said third and fourth bipolar transistors to said second constant current source, said distributing means controlling the amount of said third branch-current and the amount of said fourth branch-current depending upon a differential voltage between said interconnections so that said first and second branch-currents are inversely proportional to said third and fourth branch currents, respectively.

6. A sense amplifier circuit comprising:
   a) a differential amplifier circuit having first and second bipolar transistors controlled with an input differential voltage signal supplied to the base nodes thereof, and a first constant current source coupled between the emitter nodes of said first and second bipolar transistors and a first constant voltage source, and activated with an activation signal for allowing first and second branch-currents to respectively pass through said first and second bipolar transistors,
   b) a pair of interconnections respectively coupled with the collector nodes of said first and second bipolar transistors,
   c) a current-to-voltage converting unit having a first series combination of a first resistive element and a third bipolar transistor associated with said first bipolar transistor and coupled between a second constant voltage source and one of said pair of interconnections, a second series combination of a second resistive element and a fourth bipolar transistor associated with said second bipolar transistor and coupled between said second constant voltage source and the other of said pair of interconnections, and a third constant voltage source coupled with the base nodes of said third and fourth bipolar transistors for producing an output differential voltage signal at the collector nodes of said third and fourth bipolar transistors; and
   d) a source of standby current associated with said first and second series combinations, and having a second constant current source coupled with said first constant voltage source, and distributing means coupled between said pair of interconnections and said second constant current source and having a first diode element coupled between said one of said interconnections and said second constant current source and a second diode element coupled between said other of said interconnections and said second constant current source so as to allow third and fourth branch-currents to flow from said third and fourth bipolar transistors to said second constant current source, said first and second branch currents being inversely proportional to said third and fourth branch currents, respectively.

* * * * *